United States Patent
Alhussien et al.

(10) Patent No.: US 9,633,740 B1
(45) Date of Patent: Apr. 25, 2017

(54) READ RETRY OPERATIONS WHERE LIKELIHOOD VALUE ASSIGNMENTS CHANGE SIGN AT DIFFERENT READ VOLTAGES FOR EACH READ RETRY

(71) Applicant: Seagate Technology LLC, Cupertino, CA (US)

(72) Inventors: AbdelHakim S. Alhussien, San Jose, CA (US); Sundararajan Sankaranarayanan, Fremont, CA (US); Thuy Van Nguyen, Hanoi (VN); Ludovic Danjean, San Jose, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/041,501

(22) Filed: Feb. 11, 2016

(51) Int. Cl.
*G11C 16/26* (2006.01)
*G11C 16/28* (2006.01)
*G11C 16/16* (2006.01)
*G11C 16/34* (2006.01)
*H03M 13/11* (2006.01)

(52) U.S. Cl.
CPC .............. *G11C 16/26* (2013.01); *G11C 16/16* (2013.01); *G11C 16/28* (2013.01); *G11C 16/3431* (2013.01); *H03M 13/1125* (2013.01)

(58) Field of Classification Search
CPC ..... G11C 16/28; G11C 16/16; G11C 16/3431; G11C 16/04; G11C 16/10; G11C 16/26; G06F 11/00; G06F 11/10; G06F 12/02; H03M 13/05
See application file for complete search history.

(56) References Cited

U.S. PATENT DOCUMENTS

| 8,243,511 | B2 | 8/2012 | Patapoutian et al. |
| 8,392,809 | B1 * | 3/2013 | Varnica ............. H03M 13/09 365/185.03 |
| 8,607,124 | B2 | 12/2013 | Weingarten |
| 2011/0161775 | A1 | 6/2011 | Weingarten |
| 2012/0317460 | A1 | 12/2012 | Chilappagari et al. |
| 2013/0173985 | A1 * | 7/2013 | Chung ............. H03M 13/1111 714/755 |

(Continued)

*Primary Examiner* — Harry W Byrne
*Assistant Examiner* — Ajay Ojha
(74) *Attorney, Agent, or Firm* — Ryan, Mason & Lewis, LLP

(57) ABSTRACT

Read retry operations in a memory employ likelihood value assignments that change sign at different read voltages for a plurality of read retry operations. A method for multiple read retries of a memory comprises reading a codeword using a first read voltage to obtain a first read value; mapping the first read value to first likelihood values based on a first likelihood value assignment that changes sign substantially at the first read voltage; reading the codeword using a second read voltage to obtain a second read value, wherein the second read voltage is shifted from the first read voltage to compensate for an expected change in analog voltages; and mapping the second read value to second likelihood values based on a second likelihood value assignment, wherein the second likelihood value assignment changes sign substantially at the second read voltage. Read data is optionally generated using iterative decoding of the codeword based on the first likelihood values and/or the second likelihood values.

20 Claims, 7 Drawing Sheets

(56) References Cited

U.S. PATENT DOCUMENTS

| | | |
|---|---|---|
| 2015/0039842 A1 | 2/2015 | Fitzpatrick et al. |
| 2015/0052387 A1 | 2/2015 | Kern et al. |
| 2015/0149840 A1 | 5/2015 | Alhussien et al. |
| 2015/0162057 A1 | 6/2015 | Alhussien et al. |
| 2015/0243363 A1* | 8/2015 | Wu .................... G11C 11/5642 365/185.18 |
| 2016/0247576 A1 | 8/2016 | Park |

* cited by examiner

| READ | LLR 0 | LLR 1 | LLR 2 | LLR 3 | LLR 4 | LLR 5 | LLR 6 | LLR 7 |
|---|---|---|---|---|---|---|---|---|
| 1 | 6 | −5 | | | | | | |
| 2 | 5 | 2 | −6 | | | | | |
| 3 | 5 | −1 | −2 | −6 | | | | |
| 4 | 5 | 4 | 2 | 1 | −6 | | | |
| 5 | 6 | −1 | −2 | −4 | −5 | −6 | | |
| 6 | 6 | 5 | 4 | 2 | 1 | −1 | −6 | |
| 7 | 5 | 1 | −1 | −2 | −4 | −5 | −6 | −7 |

LSB

READ RETRY OPERATIONS WHERE LIKELIHOOD VALUE ASSIGNMENTS CHANGE SIGN AT DIFFERENT READ VOLTAGES FOR EACH READ RETRY

CROSS-REFERENCE TO RELATED APPLICATIONS

The present application is related to United States Published Patent Application No. 2015/0149840, filed Dec. 20, 2013, entitled "Read Retry For Non-Volatile Memories," (now U.S. Pat. No. 9,209,835); and United States Published Patent Application No. 2015/0162057, filed Dec. 20, 2013, entitled "Multiple Read retries in a Read Channel of a Memory," (now U.S. Pat. No. 9,236,099), each incorporated by reference herein in its entirety.

FIELD

The field relates generally to solid state storage media and more particularly to adjustments of read threshold voltages for such solid state storage media.

BACKGROUND

Solid state storage devices use analog memory cells to store data. Each memory cell stores a storage value, such as an electrical voltage. The storage value represents the information stored in the memory cell. Many solid state storage devices distinguish between different binary values that a memory cell may store based on a read voltage level of the memory cell. The range of possible storage values for each memory cell is typically divided into threshold regions, with each region separated by a read threshold voltage and corresponding to one or more data bit values. Ideally, all of the memory cells in a given solid state storage device have identical read threshold voltages for the logical bit values stored. In practice, however, the read threshold voltages differ across the cells in probability distributions along the read threshold voltage axis (e.g., "read threshold voltage distributions") that are similar to a Gaussian distribution.

In addition, solid state storage devices can shift over time. For example, memory cell leakage, memory cell damage and other disturbances to memory cells can alter the read voltage levels of the memory cells. Thus, the read threshold voltages can shift over time. The rate of leakage and other disturbances can also increase with age as memory cells are used over time. If the read voltage level of a memory cell shifts past a read threshold voltage, a data error occurs, as the value of the data read from the memory cell is different than the value of the data that was written to the memory cell.

Data is read from a non-volatile memory in blocks referred to herein as a "read unit" or as a "codeword" that is typically protected from error by included error correction, such as included parity bits generated using an error correction algorithm, such as low density parity check (LDPC) encoding. Under control of a solid state disk controller, bits are read from non-volatile memory cells. The resulting data is decoded to apply the error correction algorithm, for example, in LDPC decoder. If the data fails to converge in the LDPC decoder, a read retry operation can be used to re-read the data and to again apply the error correction algorithm. Although cell voltage is continuous, non-volatile memory cells generally provide only binary hard decisions after a read operation. When soft iterative decoding algorithms, such as LDPC decoding algorithms, are used for error correction, it is desirable to convert the hard decisions generated by the non-volatile memory into soft decisions that give the decoder more information to help correct errors. The soft decisions converted from a single read may not be of sufficient quality for successful decoding. In this case, multiple reads with varying read voltages can be used to obtain sufficient quality of the soft decisions. Thus, the location and frequency of the read reference voltages can directly affect the quality of the soft decision and eventually, the theoretic information content of the channel reads.

A need remains for improved techniques for performing read retry operations.

SUMMARY

Illustrative embodiments of the present invention provide methods and apparatus for read retry operations where likelihood value assignments change sign at different read voltages for a plurality of read retry operations. In one embodiment, a method for multiple read retries of a memory comprises reading a codeword from the memory using a first read voltage to obtain a first read value; mapping the first read value to one or more first likelihood values based on a first likelihood value assignment, wherein the first likelihood value assignment changes sign substantially at the first read voltage; reading the codeword of the memory using a second read voltage to obtain a second read value, wherein the second read voltage is shifted from the first read voltage to compensate for an expected change in one or more analog voltages of one or more memory cells of the memory; and mapping the second read value to one or more second likelihood values based on a second likelihood value assignment, wherein the second likelihood value assignment changes sign substantially at the second read voltage.

In at least one embodiment, read data is generated using iterative decoding of the codeword based on one or more of the first likelihood values and the second likelihood values. A given read voltage is optionally stored that provides a successful decoding, wherein the given read voltage is used as one or more of the first read voltage and a higher priority retry read voltage for future read operations for pages of a page type of the codeword. The page type comprises, for example, one or more of pages written at a substantially similar time, pages having a substantially similar page location in a memory block and pages having burst errors at a substantially similar time.

In one or more embodiments, the second read voltage is shifted from the first read voltage in a direction that compensates for the expected change in the analog voltages of the memory cells due to one or more of charge leakage, program/erase cycles, read disturb, erase disturb.

The disclosed techniques for read retry operations where likelihood value assignments change sign at different read voltages for a plurality of read retry operations overcome one or more of the problems associated with the conventional techniques described previously. These and other features and advantages of the present invention will become more readily apparent from the accompanying drawings and the following detailed description.

DETAILED DESCRIPTION

Figure 1:
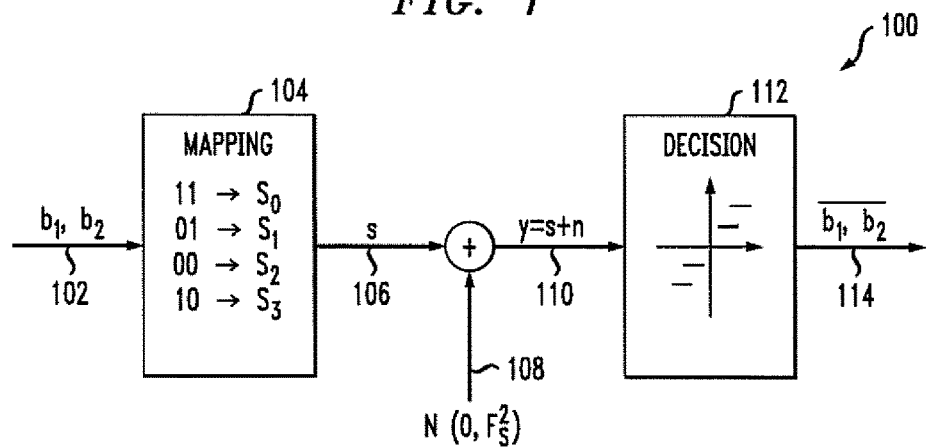
FIG. 1 illustrates a model of a non-volatile memory channel in which channel tracking can be used to adjust read retry reference voltages in accordance with one or more embodiments of the present invention.

One or more embodiments of the present invention are related to improved techniques for read retry operations. As discussed hereinafter, channel tracking includes estimating means and variances of the voltage distributions for the different data states in the non-volatile memory. If low density parity check decoding of retrieved data fails, then, in one or more embodiments, the memory controller enters into a soft low density parity check decoding operation, in which soft data is used as an input to the low density parity check decoder. In a read retry mode, multiple reads of a memory page are performed at different read reference voltages to obtain a quantized version of the stored voltage on the cell. Thereafter, the multiple read patterns for each bit is mapped to a log likelihood ratio (LLR) that represents the confidence level of the bit value being a binary zero or one. Finally, the log likelihood ratios are passed as the soft data input to the low density parity check decoder to recover the written data. Because log likelihood ratios are represented by a limited number of bits, such as, but not limited to, four bit signed integers, the possible number of log likelihood ratio values will be very limited (16 in the case of four bit signed integers). In the log likelihood ratios, the sign indicates the decision region (e.g., negative for a binary zero value and positive for a binary one value), and the magnitude indicates the confidence in the decision.

The resolution of the read voltage step is adjusted to effectively use the limited bit-width of the log likelihood ratios. In some embodiments, the multiple read patterns for each bit are mapped to log likelihood ratios using a look-up table designed to increase the probability of convergence of the low density parity check decoder at early read retries. On average, this improves the system throughput. This ensures that multi-bit patterns are mapped to proper fixed point log likelihood ratio values compared to the less robust computation of log likelihood ratios based on uniformly spaced read reference voltages. Notably, although some embodiments use log likelihood ratios, plain likelihood probability values can also be used.

According to one aspect of the invention, the log likelihood ratio values assigned to each read retry region change sign at the location of the current read voltage for multiple read retries. In this manner, the center of the LLR assignment is not constrained to be at the location of the first read in the read retry operation, or at the center of the read retry window. Among other benefits, the disclosed read retry techniques employ LLR assignments that compensate for various scenarios, such as retention, endurance and read disturb based on policies. In addition, an optimal read voltage can be identified while more read operations are performed.

Considered individually, each non-volatile memory cell has a particular stored (programmed) charge that corresponds to a device threshold voltage for that cell, and further corresponds to the logical bit values being stored in the cell. While, ideally, all of the cells in the non-volatile memory would have identical device threshold voltages for the logical bit values stored, in practice, for a variety of reasons, the device threshold voltages follow a probability distribution, e.g. a Gaussian distribution. Thus, considered in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^N$ states and the same number of device threshold voltage distributions. Thus, $2^{N-1}$ different read reference voltages may be needed by read circuits in the non-volatile memory to distinguish between the $2^N$ states.

The device threshold voltage distributions vary from their initial/nominal distributions by one or more factors, such as read disturb, write disturb, and retention loss. More particularly, over time, temperature, and other factors related to use, the location of each of the device threshold voltage distributions can change with respect to the device threshold voltage axis. Such changes increase the likelihood of read errors that are performed using a read reference voltage value for the read threshold that was previously established based on the nominal device threshold voltage distribution. In some embodiments, when a hard-decision uncorrectable error is encountered in a read unit read from non-volatile memory, a series of read retry operations is performed to recover the read unit. The read retry operations include the controller re-reading the read unit with different reference voltages, as adjusted based on channel tracking.

The read retry reference voltage adjustment disclosed herein can be applied to both single-level cell (SLC) flash memories, where N=1, and to multi-level cell (MLC) flash memories, where N>1. Single-level cell memories store one bit per cell of storage, have two device threshold voltage distributions (one for zeroes and another for ones), and use a single read threshold, read reference voltage $V_{REF0}$. From lower to higher device threshold voltages, the two device threshold voltage distributions are known as the E (Erased) state and D1 (first Data) state. While arbitrary, a mapping or coding in some embodiments assigns logical one to the E state and logical zero to the D1 state. Thus, references to zeroes and ones are proxy references for respective decodings of the D1 state and the E state. Multi-level cell memories store more than one bit per cell, have more than two device threshold voltage distributions, and use multiple different read thresholds to distinguish the distributions. For example, a four level cell memory stores two bits per cell, has four device threshold voltage distributions, and generally uses three read thresholds (read voltage references $V_{REF1}$, $V_{REF2}$, and $V_{REF3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped (addressed) in accordance with a particular binary sequence, such as a Gray code sequence. Thus, references to one or more of the 11, 10, 00, and 01 states, are proxy references for respective decodings of the E, D1, D2, and D3 states.

For a single-level memory cell, a tracking module estimates the means and variances of the voltage distributions of states D1 and E, and sets the read reference voltage $V_{REF0}$ based on these distributions. The calculated $V_{REF0}$ will lie at the intersection of the distributions when zeroes (state E) and ones (state D1) are equally likely in the written data. A read control module initiates M data reads of the addressed page from the flash device to the read buffer, with the first read at a read reference voltage of $V_{REF0}$ and the subsequent read reference voltages at different levels around $V_{REF0}$ as determined by channel tracking of the means and variances of the voltage distributions of states D1 and E. For a multi-level memory cell, the tracking module estimates the means and variances of the voltage distributions of all states.

FIG. 1 illustrates a model of a non-volatile memory channel 100 in which channel tracking can be used to adjust read retry reference voltages in accordance with one or more embodiments of the present invention. Notably, two-bit inputs with four states are used in this example, although the read retry reference voltage adjustment disclosed herein is not limited to use with any particular bit width or number of states. For two input data bits 102, the two data bits 102 $b_1$, $b_2$ can be mapped to four possible states in a mapping 104. For example, value "11" for the two data bits 102 can be mapped to state $s_0$, value "01" to state $s_1$, value "00" to state $s_2$, and value "10" to state $s_3$. For a multi-level cell, the cell is programmed to a selected state 106 from the four possible states depending on the value of the two data bits 102. As voltages representing the selected state 106 are written to and read from the memory cell, noise 108 is added due to the programming process and other inefficiencies and disturbances, yielding a noisy cell voltage 110 $y$. The noise can be considered to be an additive white Gaussian noise (AWGN), with the noise variances being different depending on the signal transmitted.

Figure 2:
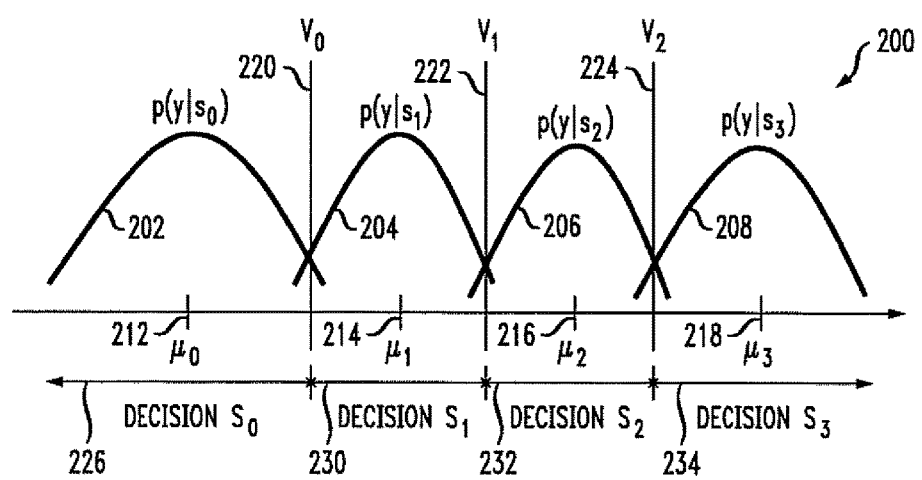
FIG. 2 is a graph of cell voltage distributions for a normal hard decision read in accordance with some embodiments of the present invention.

FIG. 2 is a graph 200 of cell voltage distributions 202, 204, 206, 208 for a normal hard decision read in accordance with some embodiments of the present invention. The resulting voltages read from the memory cell thus appear something like the distributions 202, 204, 206, 208 shown in the graph 200 of FIG. 2, rather than four distinct discrete voltage levels corresponding to the four states at the target state voltage levels 212, 214, 216, 218. Each distribution 202, 204, 206, 208 will have a mean roughly equal to the target voltage for the state, and the variance will depend upon the noise. Because the voltages on the memory cell are not accurate, the voltages read back can vary according to the distributions 202, 204, 206, 208. In some embodiments, during the initial read of the memory cell, reference voltages $V_0$ 220, $V_1$ 222 and $V_2$ 224 are used during a read to determine the state of the memory cell, returning hard decisions about the state of the memory cell.

In general, if the read voltage is below reference voltage 220, a decision (112, FIG. 1) indicates that the memory cell is determined to be in state $S_0$ 226. If the read voltage is above reference voltage $V_0$ 220 and below reference voltage $V_1$ 222, a decision indicates that the memory cell is determined to be in state $S_1$ 230. If the read voltage is above reference voltage $V_1$ 222 and below reference voltage $V_2$ 224, a decision indicates that the memory cell is determined to be in state $S_2$ 232. If the read voltage is above reference voltage $V_2$ 224, a decision indicates that the memory cell is determined to be in state $S_3$ 234.

In some embodiments, the read operation is divided into a process of reading least significant bit (LSB) pages and most significant bit (MSB) pages. States $S_0$ 226 and $S_1$ 230 correspond to a least significant bit value of 1, states $S_2$ 232 and $S_3$ 234 correspond to a least significant bit value of 0. When reading the least significant bit, the reference voltage $V_1$ 222 is applied to the memory cell, and if the voltage on the cell is above reference voltage $V_1$ 222 the least significant bit is interpreted as having a value of 0. If the voltage on the cell is below reference voltage $V_1$ 222 the least significant bit is interpreted as having a value of 1. States $S_0$ 226 and $S_3$ 234 are less likely to result in a read error than states $S_1$ 230 and $S_2$ 232, because their distributions 202 and 208 are further from the intersection of distributions 204, 206 associated with reference voltage $V_1$ 222. When reading the most significant bit, states $S_0$ 226 and $S_3$ 234 correspond to most significant bit value of 1, and states $S_1$ 230 and $S_2$ 232 correspond to most significant bit value of 0. To read the most significant bit pages, the decision criterion is different and a pair of reference voltages $V_0$ 220 and $V_2$ 224 are applied. The levels of reference voltages $V_0$ 220, $V_1$ 222 and $V_2$ 224 are supplied by a channel tracking module in some embodiments of the invention.

When reference voltages $V_0$ 220, $V_1$ 222 and $V_2$ 224 are used during a read to determine the state of the memory cell, it can result in a misread due to overlapping regions for neighboring distributions. For example, if the actual written state is $S_0$ corresponding to target state voltage level 212, but the read voltage is at the upper edge of distribution 202 above reference voltage $V_0$ 220, the decision will incorrectly identify state $S_1$ 230. In these cases, if low density parity check decoding of the data read from the non-volatile memory does not converge on the correct values and correct the errors, a retry operation is initiated.

During the read retry operation, the non-volatile memory controller enters into a soft low density parity check decoding operation, in which soft data is used as the input to the low density parity check decoder. In retry, multiple reads of a memory page are performed at different read reference voltages to obtain a quantized version of the stored voltage on the cell. Afterwards, the multiple read pattern for each bit is then mapped to a log likelihood ratio (LLR) that represents the confidence level of the bit value being 0 or 1. Finally, the log likelihood ratios are passed as the soft data input to the low density parity check decoder to recover the written data.

Figure 3:
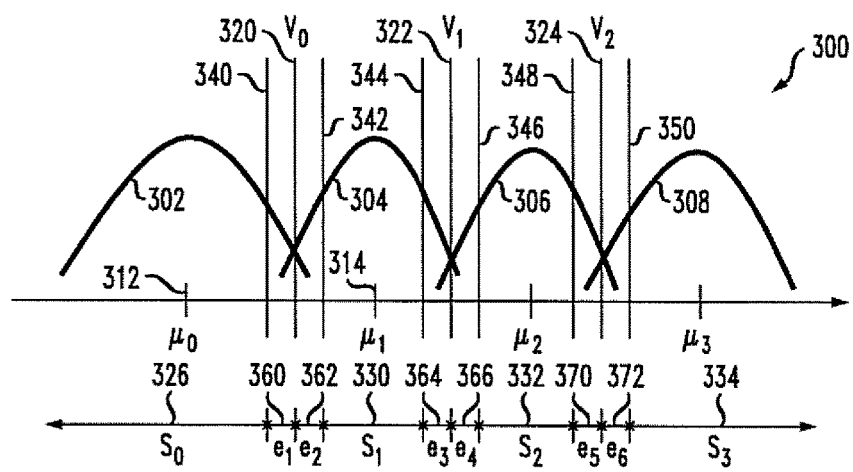
FIG. 3 is a graph of cell voltage distributions for cell voltages in different states for a retry soft decision read in accordance with some embodiments of the present invention.

FIG. 3 is a graph 300 of cell voltage distributions 302, 304, 306, 308 for cell voltages in different states for a retry soft decision read in accordance with some embodiments of the present invention. During read retries, soft decision data is generated by applying additional reference voltages 340, 342, 344, 346, 348, 350 in addition to reference voltages $V_0$ 320, $V_1$ 322 and $V_2$ 324. By performing additional read operations using different reference voltages (e.g., 344, 346), additional regions or states are defined, such as main state $S_0$ 326, $S_1$ 330, $S_2$ 332, and $S_3$ 334, and new intermediate states $e_1$ 360, $e_2$ 362, $e_3$ 364, $e_4$ 366, $e_5$ 370, and $e_6$ 372. Each is assigned a state value (e.g., {111}, {011}, {001}).

For example, when reading a least significant bit page, reference voltages 344, 322, 346 are applied in a series of read operations to determine if the least significant bit is a "0", with the memory cell in either state $S_2$ 332, or $S_3$ 334, or if the least significant bit is a "1", with the memory cell in either state $S_0$ 326, $S_1$ 330. Given three reference voltages 344, 322, 346, the hard decisions will have three bit values.

Although reference voltages can be applied in a number of different orders, affecting the hard decision results, one example of the hard decision values for three reference voltages 344, 322, 346 applied in that order is as follows. If the read voltage is below all three reference voltages 344, 322, 346 to the left of reference voltage 344, the hard decision is {111}. If the read voltage is above reference voltage 344 and below reference voltages 322, 346, the hard decision is {011}. If the read voltage is above reference voltages 344, 322 and below reference voltage 346, the hard decision is {001}. If the read voltage is above all three reference voltages 344, 322, 346, the hard decision is {000}. The hard decision can be generated bit by bit by applying each of the three reference voltages 344, 322, 346 in three successive read operations.

When reading a most significant bit page, reference voltages 340, 320, 342 and 348, 324, 350 are applied in a series of read operations to determine if the most significant bit is a "0", with the memory cell in either state $S_1$ 330 or $S_2$ 332, or if the most significant bit is a "1", with the memory cell in either state $S_0$ 326 or $S_3$ 334. If the read voltage is below reference voltage 340, the hard decision is {111}. If the read voltage is between reference voltages 340 and 320, the hard decision is {011}. If the read voltage is between reference voltages 320 and 342, the hard decision is {001}. If the read voltage is between reference voltages 342 and 348, the hard decision is {000}. If the read voltage is between reference voltages 348 and 324, the hard decision is {100}. If the read voltage is between reference voltages 324 and 350, the hard decision is {110}. If the read voltage is above reference voltage 350, the hard decision is {111}.

Notably, the likelihood that the value read from a memory cell is correct differs based on the state that is read. For example, if the read retry results in a hard decision corresponding to state $S_0$ 326, the likelihood that the memory cell actually contains the value associated with target state voltage level 312 is greater than if the read retry results in a hard decision corresponding to state $e_1$ 360, because state $S_0$ 326 is further from the intersection of distributions 302 and 304 than state $e_1$ 360.

The hard decisions of read operations can be converted into soft decisions (log likelihood ratio values) based on the knowledge of the channel. The hard decision for state $S_0$ 326 will therefore have a higher log likelihood value than the hard decision for state $e_1$ 360. A log likelihood ratio for a memory cell contains the likelihood for each possible value of the memory cell that the cell contains that value. Thus, given a four state memory cell, the corresponding log likelihood ratio for data stored in the memory cell will have four probability or likelihood values, each giving the likelihood that the memory cell contains one of the four possible values. The log likelihood ratio values are generated from the read retry operation hard decisions in any suitable manner. Based upon the disclosure provided herein, one of ordinary skill in the art will recognize a variety of techniques and equations for calculating log likelihood ratio values from the read retry operation hard decisions. In some embodiments, the log likelihood ratio values are pre-calculated for each possible read retry operation hard decision, based on expected channel characteristics, and stored in a lookup table for use during operation.

In some embodiments, when data from a read retry operation fails to converge in the decoder, another read retry operation is triggered, with a greater number of reference voltages applied, giving higher quality soft decisions to be provided to the decoder. Such a process of increasing the number of reference voltages can be continued as long as desired until a maximum number of retries is reached and a read failure is signaled.

The adjustment of read retry reference voltages disclosed herein adjusts the reference voltages to achieve a prescribed log likelihood ratio table that is designed to achieve low density parity check decoding convergence with a lower number of read retries.

Initially, the location of the intersections between distributions (e.g., 302, 304) is not known. If the read reference voltages are positioned so that read values are captured near the center of distributions (e.g., 302), the full range of the resulting log likelihood ratios will not be used and the hard read bit error rate will not be minimized. For example, if log likelihood ratios are represented using three signed bits, the range of possible log likelihood ratios is from −7 to 7. In one or more embodiments, channel tracking is performed and an algorithm is applied to inversely find the read reference voltages that will use the full resolution of possible log likelihood ratios, rather than concentrating the log likelihood ratios at the edges of the available range.

In some embodiments, the channel tracking-based read reference voltage adjustment is applied in a read retry operation. In these embodiments, a hard read is performed first, reading hard decisions and decoding those hard decisions. The hard decisions can be mapped to log likelihood ratio values for a low density parity check decoder with a soft information input, by mapping a 0 value from the memory cell to a large negative log likelihood ratio value corresponding to a 0 value, and mapping a 1 value from the memory cell to a large positive log likelihood ratio value corresponding to a 1 value.

If the decoding fails, then the read retry operation is initiated, and a soft read is performed, yielding soft information or log likelihood ratios that are decoded. In a soft read, multiple reads of a page are performed at different read reference voltages to obtain a quantized version of the stored voltage on the memory cell. The multi-bit read patterns from the memory cell are mapped to log likelihood ratios that represent the confidence level of the bit value being 0 or 1, using a lookup table. The log likelihood ratios are passed to a decoder, such as, but not limited to, a low density parity check decoder performing soft decoding, to recover the written data. An algorithm is implemented to inversely identify the reference voltages that will populate the lookup table, under the assumption that the read voltage distributions have a substantially Gaussian distribution.

In some embodiments, the algorithm to inversely identify the reference voltages that will populate the lookup table to map to log likelihood ratios is a greedy algorithm, meaning that it considers all possible values of the read reference voltages before reaching a solution for the read reference voltages to be used. It is also an inverse algorithm, meaning that it starts with the possible log likelihood ratios and then identifies the read reference voltages that will result in quantized voltages that map to log likelihood ratios that use the full resolution. By utilizing the full log likelihood ratio resolution, the low density parity check decoding is able to converge on the correct written values in a lower number of read retries. With proper choice of read reference voltages, it is observed that the limited spectrum of log likelihood ratios does not impair performance of the low-density parity-check decoder. In some embodiments, the low density parity check decoding comprises a min-sum decoding algorithm, although the channel tracking-based read retry voltage adjustment is not limited to use with any particular type of decoder.

Figure 4:
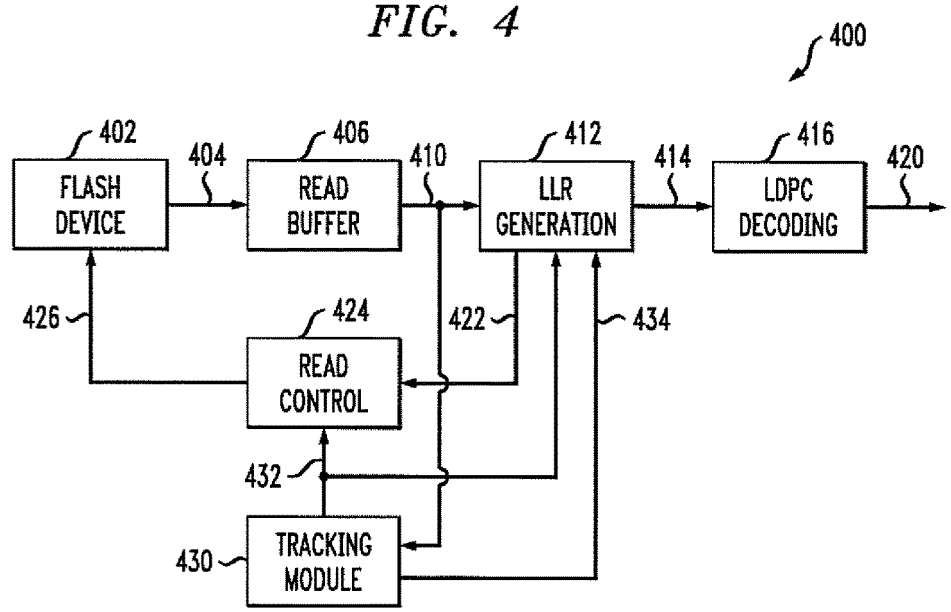
FIG. 4 illustrates a flash channel read path with channel tracking-based read retry voltage adjustment in accordance with some embodiments of the present invention.

FIG. 4 illustrates a flash channel read path 400 with channel tracking-based read retry voltage adjustment in accordance with some embodiments of the present invention. The read path 400 includes a flash device having an array of memory cells, or any other type of non-volatile memory. Based upon the disclosure provided herein, one of ordinary skill in the art will recognize a variety of storage technologies that can benefit from the channel tracking-based read retry voltage adjustment disclosed herein.

Read reference voltages 426 are applied to the flash device 402 by a read control device 424 in a series of N reads. Each memory cell is read N times, and the N reads result in read data 404 containing N bits per memory cell as a quantized version of the stored voltage on the memory cell. The read data 404 is buffered in a read buffer 406, and buffered read data 410 from read buffer 406 is provided to a log likelihood ratio generation circuit 412 (or likelihood generator, which can also be adapted to use plain likelihood values). The N bits for a memory cell are mapped to log likelihood ratios for the memory cell in log likelihood ratio generation circuit 412. In some embodiments, the log likelihood ratio generation circuit 412 contains a lookup table that maps the read patterns in buffered read data 410 to log likelihood ratios.

A tracking module 430 receives the buffered read data 410 from the read buffer 406, or from any other suitable source. Generally, channel tracking techniques adapt to the changes in read threshold voltages to maintain a desired performance level. Adaptive tracking algorithms typically track variations in the solid state storage channel and consequently, help to maintain a set of updated channel parameters. The updated channel parameters are used, for example, to adjust read threshold voltages. United States Published Patent Application No. 2013/0343131, for example, filed Jun. 26, 2012, entitled "Fast Tracking for Flash Channels," or United States Published Patent Application No. 2015/0287453, filed Apr. 15, 2015, entitled "Optimization of Read Thresholds for Non-Volatile Memory," incorporated by reference herein in its entirety, discloses techniques for adapting read threshold voltages.

The tracking module 430 identifies the intersection point between neighboring voltage distributions (e.g., 302, 304) for a memory cell that corresponds to zero log likelihood ratio, and provides read reference voltage level $V_{REF0}$ 432, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a read retry operation (see, e.g., 320), and additional read reference voltages around $V_{REF0}$ to obtain all possible log likelihood ratio values. The tracking module 430 thus generates the read reference voltage level $V_{REF0}$ 432 to be used in read retry operations. In other embodiments $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in 412 and 424.

The tracking module 430 also tracks the voltage distributions (e.g., 302, 304), calculating the means (e.g., $\mu_0$ 312, $\mu_1$ 314, etc.) and the variances $\sigma_0$, $\sigma_1$ for at least some voltage distributions (e.g., 304, 306). Given the assumption that the voltage distributions (e.g., 304, 306) have a Gaussian distribution, the voltage distribution means and variances 434 identifies the intersection points between neighboring distributions. In some embodiments, the tracking module 430 calculates the voltage distribution means and variances 434 for each voltage distribution corresponding to each possible state in each memory cell. In some other embodiments, the tracking module 430 calculates the voltage distribution means and variances 434 for each voltage distribution corresponding to each possible state in groups of memory cells. The voltage distribution means and variances 434 can be calculated in any suitable manner based on the read data. As an example, the tracking module 430 can operate as disclosed in U.S. Published Patent Application No. 2013/0343131, filed Jun. 26, 2012, entitled "Fast Tracking for Flash Channels," incorporated by reference herein in its entirety. Based upon the disclosure provided herein, one of ordinary skill in the art will recognize a variety of techniques for calculating means and variances based on data sampled from Gaussian distributions. However, the tracking module 430 is not limited to any particular tracking algorithm. For example, in some other embodiments, the tracking module 430 tracks intersections without estimating means or variances. Even in cases where means and variances are not or cannot be tracked, in some embodiments, a pre-characterized table of means and variances for the purpose of determining reference voltages is used. In instances where the likelihood map is altered dynamically, reference voltage gaps are computed dynamically as well. Thus, the phrase "calculating means and variances" herein also refers to embodiments using pre-characterized tables of means and variances.

For a two-state memory cell, or single-level memory cell, the tracking module 430 estimates the means and variances of the voltage distributions of states "1" and "0", as well as the read reference voltage $V_{REF0}$ that most reduces the bit error rate and which likely lies at the intersection of those distributions when 0's and 1's are equally likely in the written data.

The tracking module 430 provides the voltage distribution means and variances 434 to the log likelihood ratio generation circuit 412 for use in updating the log likelihood ratio lookup table. The log likelihood ratio generation circuit 412 is used to calculate likelihood values for decoding purposes. The log likelihood ratio generation circuit 412 also determines where to place the other N−1 read reference voltages around $V_{REF0}$ 432 based on the voltage distribution means and variances 434 and on the read reference voltage $V_{REF0}$ 432 to obtain all possible log likelihood ratio values when the read patterns in buffered read data 410 are mapped to log likelihood ratios. The log likelihood ratio generation circuit 412 determines where to place the other N−1 read reference voltages around $V_{REF0}$ 432, updates the lookup table, and provides the N−1 read reference voltage levels 422 to a read controller 424. It is important to note that the division of functionality is not limited to the example embodiments disclosed herein. For example, in other embodiments, the tracking module 430 calculates and provides read reference voltages around $V_{REF0}$ 432 and provides those voltages to the log likelihood ratio generation circuit 412, rather than the log likelihood ratio generation circuit 412 determining where to place the other N−1 read reference voltages around $V_{REF0}$ 432, and these divisions of functionality are to be seen as equivalent.

The channel tracking-based read retry voltage adjustment algorithm is implemented in the log likelihood ratio generation circuit 412 based on the channel tracking information provided by the tracking module 430. The read reference voltages are stored in log likelihood ratio generation circuit 412 in some embodiments, as calculated based on the log likelihood ratio lookup table in log likelihood ratio generation circuit 412 and on the voltage distribution means and variances 434 from tracking module 430.

The read controller 424 controls the read retry operations in the flash device 402, providing each of the N read reference voltages (including $V_{REF0}$ 432) to be used when reading the memory cells in the flash device 402. The read controller 424 initiates N reads of a page, with the first read using read reference voltage $V_{REF0}$ in some embodiments, and with the subsequent N−1 reads at read references voltages around $V_{REF0}$ as determined by log likelihood ratio generation circuit 412.

As an example for a single-level memory cell, the bits are stored at two possible threshold voltages. The threshold voltages levels follow the Gaussian probability density function with equal variances for a centered intersection. The levels, denoted by logical 0 and 1, have means $\mu_0 = -1$ v and $\mu_1 = 1$ v, respectively, which can be found by channel tracking. The optimal read reference voltage $V_{REF0}$ can be found in this example by channel tracking to be at 0 volts. A low density parity check decoder is used to decode the least significant bit pages using a soft decoding algorithm, using a four-bit log likelihood ratio having a range [−8, 7], although other fixed point representations can also be used.

Figures 5, 6:
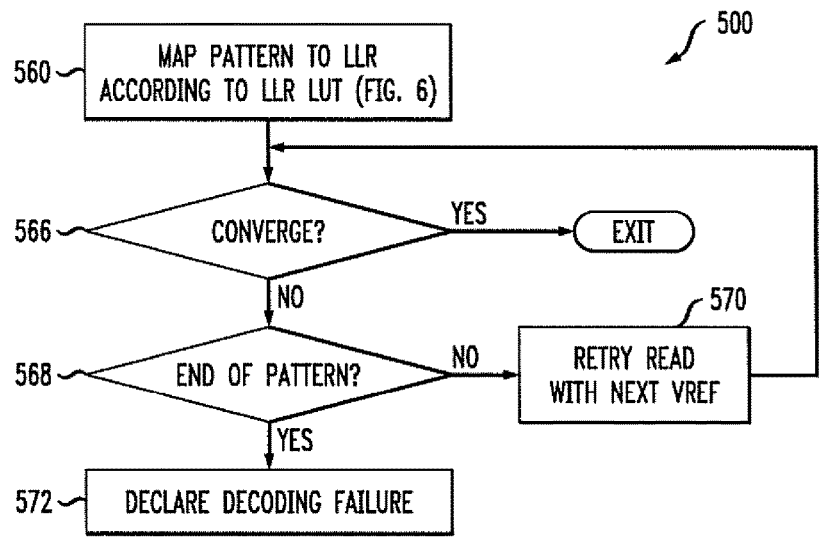
FIG. 5 is a flow diagram of a soft decision decoding process according to one embodiment.
FIG. 6 is a lookup table of default log likelihood ratio values for a plurality of read retry operations.

FIG. 5 is a flow diagram of a soft decision decoding process 500 according to one embodiment. The soft decision decoding process 500 may be implemented, for example, by the read controller 424 of FIG. 4. As shown in FIG. 5, the soft decision decoding process 500 initially maps the obtained pattern to an LLR value during step 560, using the LLR LUT 600, discussed further below in conjunction with FIGS. 6 and 7. A test is performed during step 566 to determine if the decoding converges. If it is determined during step 566 that the decoding converges, then program control ends. If, however, it is determined during step 566 that the decoding does not converge, then the process 500 checks during step 568 to see if an end of the read retry pattern has been reached. If one or more additional read reference voltages of the pattern remain to be used, the next reference voltage is obtained during step 570, the codeword is subsequently re-read based on the next read reference voltage and program control returns to step 566 and continues in the manner described above. A loop around the step 560 to the step 570 and back again generally continues until either a convergence is reached in the step 566 or all of the read reference voltages have been tried per the step 568. If decoding has not been successful after a last read retry has been made and a last set of log likelihood ratio values has been used in the decoding, a decoding failure is declared during 572 and the process 500 ends.

In some embodiments, the log likelihood ratio (soft) values are calculated as part of a design process based on multiple rules. The rules generally include, but are not limited to, the following rules:

Rule 1: When two reads enclose the preferred read location, but that preferred read has not yet been done, the modified log likelihood ratio values for the decision region should be 0, which reflects equal likelihood of the binary decision values.

Rule 2: The first and last log likelihood ratio values should be the same to enable storage of only the lower page tables and, then, stitch the lower page tables together to generate upper page tables in case savings in variable space is needed.

Rule 3: The log likelihood ratio value signs at the right and left of the preferred read location have opposite signs, which is due to the natural single modality of noise distributions.

Rule 4: The log likelihood ratio values grow in magnitude as decisions regions are further away from the preferred read locations indicating higher confidence in the binary decision value.

Rule 5: The log likelihood ratio value magnitudes grow almost linearly in the number of delta shifts away from the preferred read locations, which is due to the exponential decay in the tails of the noise distributions.

Rule 6: The first and last log likelihood ratio values are scaled down in magnitude from a maximum possible value in a fixed point representation to improve performance in a low density parity check decoding error floor since if write-side errors occur it results in faster saturation of the variable LLR of the decoding process, so scaling down LLR values delays the decoder getting stuck in near-codeword and improves error floor behavior as a result.

Rule 7: An exception to rule 6 happens if too many decision regions would have repeated log likelihood ratio values if scaling down, then, the largest possible log likelihood ratio value is used so as not to waste the available read retries. In practice, however, rules 6 and 7 are a tradeoff of error floor versus waterfall behavior, and a specific channel without write-side errors may benefit from following rule 7 rather than rule 6.

Rule 8: The first or last log likelihood ratio value is scaled down even further from that in rule 6 if the preferred read location is to the left of the leftmost read or to the right of the rightmost read at any read retry stage. There would be many more errors of lower decision confidence with this choice, thereby improving the convergence probability of the decoder as a result.

Rule 9: The log likelihood ratio (LLR) values assigned to each read retry region change sign at the location of the read voltage/voltages for multiple read retries that is (are) most likely to minimize the genie bit error rate BER (e.g., using known bit values) or a correlated metric to the BER.

FIG. 6 is a lookup table 600 of default log likelihood ratio values for the least significant bits (LSBs) for a plurality of read retry operations. Table 600 generally illustrates a lookup table for a two-bit per cell type memory. Table 660 is stored, for example, by read controller 424. A center of the voltage sweep window being retried, and thus the initial read retry in FIG. 3, is chosen to reduce the corresponding lower page and upper page bit error rates. Lowering the bit error rates uses side information, available in the form of the means μ and variances σ of the charge-state probability distributions 302, 304, 306, 308. However, if such information about the statistics of a certain state is not readily available, the corresponding log likelihood ratio values cannot be computed as the means and variances to plug into the likelihood computation formulas would not be available. In other scenarios, obtaining such information is costly, inaccurate, or is not supported by the flash architecture in an efficient manner.

In such situations, a default lookup table (e.g., LUT) can be used to map decision regions (e.g., multi-read patterns) into predefined log likelihood ratio values. In one or more embodiments, different tables can be maintained for different flash types and/or different channel conditions. For example, different lookup tables are stored for different program/erase cycle (e.g., PEC) points or read disturb cycles. In addition, different log likelihood ratio values can be maintained by the controller 424 for odd and even wordlines in even-odd architectures, or for single level cell (e.g., SLC) blocks, embedded single-level cell pages, or lower page only (e.g., LPO) pages. Those lookup tables can be modified dynamically (e.g., on the fly) based on some metric or based on some representative characterization of the flash part that pertains to the current measured channel condition (such as endurance, retention, or read disturb etc.) or specific to the current geometry (even/odd wordline, middle/edge wordline, or middle/edge block).

Lookup table 600 shows an embodiment of a default table that has the characteristics of being symmetric around the initial read, though LLR can also be asymmetric in general, has LLR values assigned to each read retry region that change sign from positive to negative at the location of the substantially optimal read voltage for each read retry, has no zero log likelihood ratio values, and the log likelihood ratio values are drawn from a fixed point Q4.0 signed representation. Although the largest entries in the signed representation can be negative (e.g., −8) or positive (e.g., +7), smaller maximum entries are chosen to reduce the occurrence of saturated log likelihood ratio values at error locations, which can be as issue in low density parity check soft decoding. The entries of the lookup table can be different for different flash types, which is decided in the process of qualifying the flash with the controller using the scheme herein. Hence, the lookup table can look different, for example, by being non-symmetric and/or have zero entries for other flash types or persistent channel impairments.

The lookup table 600 for LSBs in the embodiment of FIG. 6 is easily extendable to MSB pages with two or more sensing reference voltages by a person of ordinary skill in the art. In general a flash page type can have multiple sensing voltages even above two, such as in TLC flash devices. In such cases, the size of the LLR lookup table 600 will grow accordingly as function of the number of reference voltages to read a page. The decision regions surrounding each of the reference voltages can be distinguished by doing extra reads of other pages in the same wordline or based on the multiple-bit read patterns. In all cases, the concepts and rules disclosed herein can be extended to such pages to calculate LLRs for pages with multiple reference voltages.

In this manner, at each read retry, different LLR constellations are invoked based on metrics, such as disparity, syndrome weight of previous decoding attempt and/or history of such metrics. In one or more embodiments, the LLR lookup table 600 targets various scenarios, such as endurance, retention, read disturb, variation across dies and variation across pages. For instance, to reflect an optimal read voltage above a default voltage (such as in high endurance or read disturb), the LLR sign change can be picked at a read higher than read at default voltage. To reflect an optimal voltage below the default voltage (such as in retention noise of states other than Erase state), then the LLR sign change can be picked at a read lower than read at default voltage. To reflect variation across geometry, different pages can have a different sign change based on the page locality in a block or flash die. These locality variations can be studied offline and used to pick LLR values and sign change location accordingly.

In one or more embodiments, the LLR values stored in the table 600 (or generated dynamically in an alternate implementation) can be adjusted based on channel conditions and decoding performance, as discussed further below in conjunction with FIG. 9. Specifically, the retry algorithm can keep track of the history of successful read voltages and use them for the retry of other pages with similar channel condition or locality as the successfully recovered page. Similarity in channel condition can be assumed, for example, for pages written and erased at the same time, read the same number of times, or exposed to the same temperature condition by virtue of co-location on the die. Similarity in geometry can be based, for example, on belonging to the same region of the die or block that exhibits similar error behavior due to similar inter-cell inference (ICI) or physical properties on the underlying memory cells. In open blocks, on the other hand, i.e., blocks that have been only partially programmed, some pages that have been recently programmed can share LLR lookup tables as well due to the special ICI noise they exhibit compared to other pages in the block that are erased or are far from current programming boundary.

As noted above, one aspect of the invention assigns LLR values to each read retry region such that the LLR values change sign from positive to negative at the location of the current read voltage for each read retry. In this manner, the center of the LLR lookup table 600 (LLR=0) is not constrained to be at the location of the first read, or the center of the retry window. Thus, the optimal $V_{REF0}$ can be searched for while additional reads are performed.

Generally, when channel tracking/estimation is enabled and possible (e.g., channel information is available), then the first read operation is performed using the read threshold voltage that is considered optimal in a raw BER sense and the center of the read retry window (LLR=0) is first read. When channel information is not available, however, the disclosed method compensates for this lack of channel knowledge by changing the assumption about optimal read in a raw BER sense at each additional read operation that follows an LDPC failure. It is also advisable to compensate for lack or inaccuracy of the read threshold voltage of tracking for reasons related to the kind of tracking that is implemented. For instance, if the statistics collected by tracking are averaged over multiple pages of different regions in the flash, then the estimated read reference voltage is only good for the average page and hence the read voltage of outlier pages needs to be adjusted dynamically (e.g., on the fly) or in picking an LLR sign change in read retry. Also, tracking can only be run infrequently due to its cost or latency that lags channel changes, and hence deviations from the latest tracking estimation need to be accounted for. Those deviations can arise, for example, due to a passage of time under high temperature since last estimation (retention), or further reads of the page since last estimation (read disturb). In addition, the page could have been erased and programmed a non-trivial number of times since last tracking run and have thus endured more wearing and are more susceptible to losing/gaining charge due to the aforementioned noises.

A significant motivation to devoting more reads to search for a substantially optimal reference voltage is that the performance of soft LDPC quickly saturates at each additional read operation and the benefit for soft decoding succeeding after three read operations is minimal; hence, in the disclosed method, the algorithm diverts additional reads towards finding a minimum BER, so that those additional read operations are not wasted. The BER would be based on a difference between read data and decoded data or another metric related to it, such as, a number of un-satisfied parity checks after decoding failure, or the balance of ones and zeroes in the read that is otherwise equally likely to be one or zero.

In one or more embodiments, once LDPC decoding succeeds at a certain voltage shift, the successful voltage shift is used first for the next read retry of the next codeword, thereby improving throughput and helping to break burst errors. One or more embodiments tailor read retry on a page-by-page basis, rather than using the same tracking assumption about LLR=0 location for all pages in a block or across dies.

Figure 7:
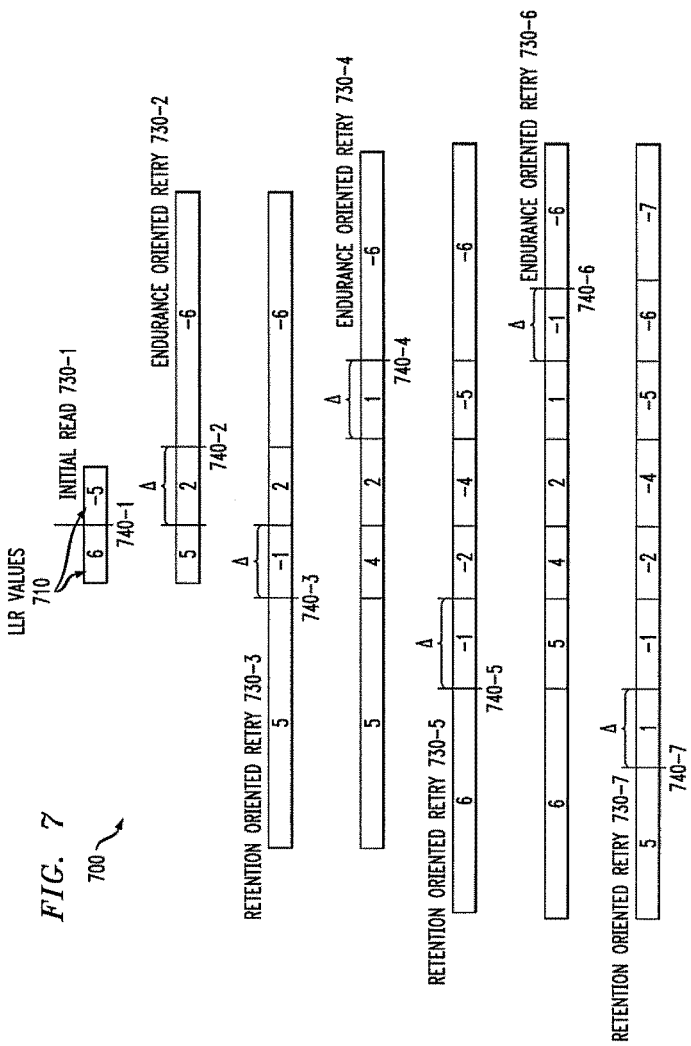
FIG. 7 illustrates a number of successive read operations performed in accordance with an embodiment of the invention, using LLR value assignments from the lookup table of FIG. 6.

FIG. 7 illustrates a number of successive read operations 700 performed in accordance with an embodiment of the invention, using LLR value assignments 710 from the lookup table 600 of FIG. 6. Generally, the read retry mode is implemented to compensate for deficiencies in the channel tracking. The read retry mode is optionally enhanced with knowledge obtained from successful decodings, as discussed further below in conjunction with FIGS. 8 and 9. The LLR values in the LLR constellations change sign at the location of the reference voltage used for each successive read operation or one from the past read operations in a read retry mode. In this manner, the successive read operations 700 compensate for incorrect reference voltages from the channel tracking module 430. The LLR sign change can be picked at the same read voltage more than once, as with additional reads the quality of soft information improves by the additional number of decision regions generated. In one or more embodiments, this is a hybrid approach of two prior techniques. The first technique performs a hard read at different read reference voltage and attempts decoding only using the current sign information without aggregating the past reads and current read. The other technique is to aggregate multiple reads but maintain the same assumption about location of optimal read voltage.

As shown in FIG. 7, for the initial read retry operation 730-1, which can be the past failed normal read or a fresh read retry read, the log likelihood ratio generation circuit 412 (FIG. 4) places the reference voltage 740-1 at $V_{REF0}$. This reference voltage is in the middle, where the voltage distributions intersect and are equal so that the read result is equally likely to be in either state (minimizing the probability of bit error and maximizing probability of decoding success), and such a read result in which binary decisions are equally likely is mapped to log likelihood ratio 0. This also allows read reference voltages to be positioned in subsequent read retries around $V_{REF0}$ to fully use the log likelihood ratio resolution and range. Thus, in the first read retry in some embodiments, the reference voltage is placed at 0 volts offset from default or initial voltage, and the log likelihood ratio constellation, the log likelihood ratio values to which the resulting two-state read data is mapped, is {6, −5}. The LLR values in the log likelihood ratio constellation change sign at the location of the reference voltage 740-1.

In one or more embodiments, the initial reference voltage 740-1 ($V_{REF0}$) is a preferred (or calculated) read reference voltage. In various embodiments, the preferred read voltage $V_{REF0}$ is supplied by a reference voltage tracking technique. In some embodiments, the reference voltage $V_{REF0}$ is a default voltage that is chosen to match a specific worst case program/erase cycle or retention condition. It is noted that the default lookup table 600 in FIG. 6 is tailored for the read sequence in FIG. 7, which if changed implies that the LLR values of the default table 600 should be changed accordingly.

For the second read retry operation 730-2 in some embodiments, the log likelihood ratio constellation is set at {5, 2, −6} to perform a retry that compensates for endurance effects (e.g., assumes that the threshold voltage has increased due to program/erase cycle effects). An additional reference voltage 740-2 is set at a voltage offset $\Delta$ with respect to the first reference voltage 740-1.

In one or more embodiments, $\Delta$ is programmable with a certain default value for a specific flash type, channel condition, or page locality. In an offline determination of the $\Delta$ voltage for a specific flash type, several targets are to be achieved. For example, the targets may include improving a probability of soft decoding convergence after a specified maximum number of read retries, and improving a probability of soft decoding convergence per read retry. Another target would be to reduce the occurrence of limited sweep issues, where the several read retries cannot be placed all within the sweep limits if centered around the preferred read reference voltage $V_{REF0}$. A larger fixed voltage $\Delta$ will increase a frequency of such corner cases. A smaller $\Delta$ voltage will result in an increase in the frequency of illegal read patterns (multi-read hard patterns to be converted to LLRs) due the effect of read noise. Also, a smaller value of $\Delta$ would limit the maximum and minimum voltage deviation in the optimal reference voltage disclosed herein, and hence, a larger $\Delta$ would make it easier to reach the optimal reference voltage, especially if the average optimal voltage found by tracking is far from the true optimal.

Thus, the second read retry operation 730-2 includes reads using 740-1 ($V_{REF0}$) and the additional reference voltage 740-2 set at $V_{REF0}+\Delta$. In at least one embodiment, for the second read retry operation 730-2, only one new read operation is performed using reference voltage 740-2, and the prior readings for reference voltage 740-1 is reused (and similarly for subsequent read retry operations 730). The two reference voltages 740-1 and 740-2 result in read data representing three possible states, which are mapped to the three-entry log likelihood ratio constellation {5, 2, −6}. The LLR values in the log likelihood ratio constellation change sign at the location of the reference voltage 740-2.

Decoding is performed on the log likelihood ratios resulting from the second read retry 730-2, and if low density parity check decoding successfully converges, the read operation is finished. Otherwise, a third read retry 730-3 can be initiated.

For the third read retry operation 730-3 in some embodiments, the log likelihood ratio constellation is set at {5, −1, −2, −6} to perform a retry that compensates for retention effects (e.g., assumes that the threshold voltage has decreased due to charge leakage effects). An additional reference voltage 740-3 is set at reference voltage 740-1 minus $\Delta$. Thus, the third read retry operation 730-3 includes reads using 740-1 ($V_{REF0}$), the additional reference voltages 740-2, 740-3 set at $V_{REF0}+\Delta$ and $V_{REF0}-\Delta$, respectively. The three reference voltages result in read data representing four possible states, which are mapped to the four-entry log likelihood ratio constellation {5, −1, −2, −6}. The LLR values in the log likelihood ratio constellation change sign at the location of the reference voltage 740-3.

Decoding is performed on the log likelihood ratios resulting from the third read retry operation 730-3, and if low density parity check decoding successfully converges, the read operation is finished. Otherwise, a fourth read retry operation 730-4 can be initiated.

For the fourth read retry operation 730-4 in some embodiments, the log likelihood ratio constellation is set at {5, 4, 2, 1, −6} to perform a retry that compensates for endurance effects. An additional reference voltage 740-4 is set at reference voltage 740-1 plus $2\Delta$. Thus, the fourth read retry operation 730-4 includes reads using 740-1 ($V_{REF0}$), the additional reference voltages 740-2, 740-3, 740-4 set at $V_{REF0}+\Delta$ and $V_{REF0}-\Delta$ and $V_{REF0}+2\Delta$, respectively. The four reference voltages result in read data representing five possible states, which are mapped to the five-entry log likelihood ratio constellation {5, 4, 2, 1, −6}. The LLR values in the log likelihood ratio constellation change sign at the location of the reference voltage 740-4.

For the fifth read retry operation 730-5 in some embodiments, the log likelihood ratio constellation is set at {6, −1, −2, −4, −5, −6} to perform a retry that compensates for retention effects. An additional reference voltage 740-5 is set at reference voltage 740-1 minus 2Δ. Thus, the fifth read retry operation 730-5 includes reads using 740-1 ($V_{REF0}$), the additional reference voltages 740-2, 740-3, 740-4, 740-5 set at $V_{REF0}+\Delta$ and $V_{REF0}-\Delta$ and $V_{REF0}+2\Delta$ and $V_{REF0}-2\Delta$, respectively. The five reference voltages result in read data representing six possible states, which are mapped to the six-entry log likelihood ratio constellation {6, −1, −2, −4, −5, −6}. The LLR values in the log likelihood ratio constellation change sign at the location of the reference voltage 740-5.

For the sixth read retry operation 730-6 in some embodiments, the log likelihood ratio constellation is set at {6, 5, 4, 2, 1, −1, −6} to perform a retry that compensates for endurance effects. An additional reference voltage 740-6 is set at reference voltage 740-1 plus 3Δ. Thus, the sixth read retry operation 730-6 includes reads using 740-1 ($V_{REF0}$), the additional reference voltages 740-2, 740-3, 740-4, 740-5, 740-6 set at $V_{REF0}+\Delta$ and $V_{REF0}-\Delta$ and $V_{REF0}+2\Delta$ and $V_{REF0}-2\Delta$ and $V_{REF0}+3\Delta$, respectively. The six reference voltages result in read data representing seven possible states, which are mapped to the six-entry log likelihood ratio constellation {6, 5, 4, 2, 1, −1, −6}. However, the LLR values in the log likelihood ratio constellation change sign at the location of the reference voltage 740-4, and not the read location at 740-6. The unique addition to the retry attempt 730-6 is that 730-6 has more decision regions around 740-4 and has higher probability of decoding success than 730-4, if 740-4 corresponds to the optimal read.

For the seventh read retry operation 730-7 in some embodiments, the log likelihood ratio constellation is set at {5, 1, −1, −2, −4, −5, −6, −7} to perform a retry that compensates for retention effects. An additional reference voltage 740-7 is set at reference voltage 740-1 minus 3Δ. Thus, the seventh read retry operation 730-7 includes reads using 740-1 ($V_{REF0}$), the additional reference voltages 740-2, 740-3, 740-4, 740-5, 740-6, 740-7 set at $V_{REF0}+\Delta$ and $V_{REF0}-\Delta$ and $V_{REF0}+2\Delta$ and $V_{REF0}-2\Delta$ and $V_{REF0}+3\Delta$ and $V_{REF0}-3\Delta$, respectively. The seven reference voltages result in read data representing eight possible states, which are mapped to the six-entry log likelihood ratio constellation {5, 1, −1, −2, −4, −5, −6, −7}. However, the LLR values in the log likelihood ratio constellation change sign at the location of the reference voltage 740-5, and not the read location at 740-7. The unique addition to the retry attempt 730-7 is that 730-7 has more decision regions around 740-5 and has higher probability of decoding success than 730-5 if 740-5 corresponds to the optimal read.

Decoding is performed on the log likelihood ratios resulting from the seventh read retry operation 730-7, and if low density parity check decoding successfully converges, the read operation is finished. Otherwise, additional read retry operations can be initiated up to a predetermined maximum retry number, following the pattern of adding an additional reference voltage 740-7, to alternately perform retries that compensate for retention effects and endurance effects with each retry employing LLR values in the log likelihood ratio constellation that change sign at the location of the respective reference voltage or other past reads that have been attempted before, until the log likelihood ratio constellation includes every possible value within the log likelihood ratio range. The number of read retry operations performed is not limited to any particular number. After performing a desired number of read retry operations in an attempt to correctly read and decode the data written to the memory cells, if decoding has not succeeded, a read fault can be indicated and the operation terminated or additional error recovery operations can be initiated.

In summary, a constellation of log likelihood ratios is selected, corresponding to the range of log likelihood ratio values that is desired in the read results, and the reference voltage levels that can result in those log likelihood ratio values are calculated, based on means and variances obtained through channel tracking. Thus, the multi-bit read patterns are mapped to predetermined log likelihood ratios that have the desired spacing within the log likelihood ratio range and LLR values in the log likelihood ratio constellation that change sign at the location of the respective read reference voltage or a past read voltage from the decoding trials that failed before, rather than calculating log likelihood ratios for read patterns resulting from uniformly spaced read reference voltages.

In one or more embodiments of the read retry mode, the initial reads are optimized for end-of-life (e.g., endurance effects) followed by reads that are optimized for beginning-of-life (e.g., retention) (since a recently fabricated solid state memory will typically exhibit very small bit error rates (BERs).

The channel tracking based read retry voltage adjustment disclosed herein allows a more complete use of the resolution of the log likelihood ratios, improving the placement of the reference voltages to result in read data with patterns that map to log likelihood ratios that are not concentrated in relatively small portions of the log likelihood ratio range. By selecting the reference voltages for the read retry operations, the chances of early decoding success are improved and the overall throughput is increased. Dynamic selection of read reference voltages gives the ability to adjust or adapt to changing channel conditions. In effect, channel quality information is extracted from tracking estimates to effectively select read-retry voltages.

Figure 8:
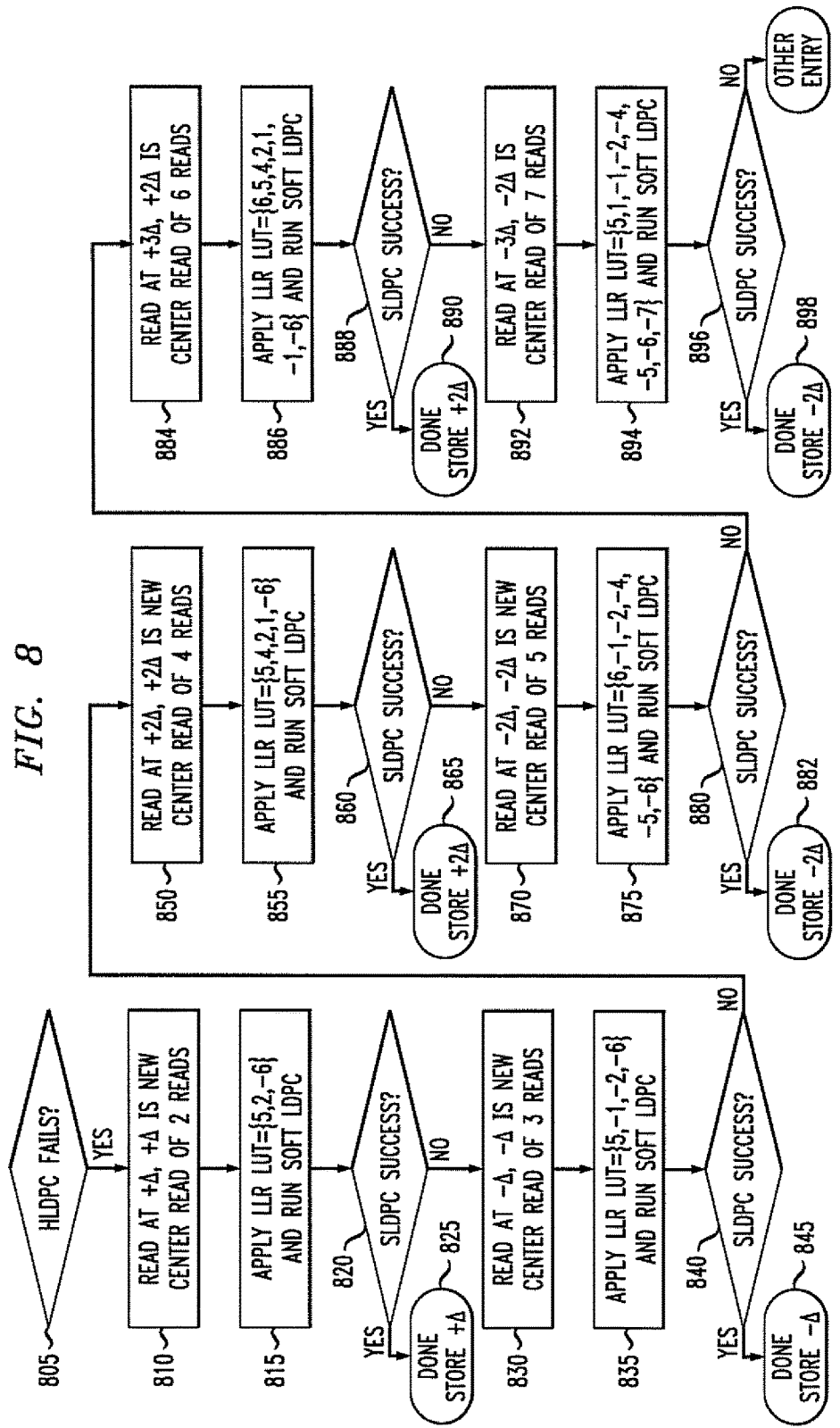
FIGS. 8 and 9 are flow charts illustrating implementations of a read retry process according to embodiments of the invention.

FIG. 8 is a flow chart illustrating an implementation of a read retry process 800 according to one embodiment of the invention. As shown in FIG. 8, if it is determined during step 805 that the hard LDPC decoding has failed, then the read retry process 800 performs a read operation at +Δ during step 810, where +Δ is new center read (e.g., where the LLRs change sign) of two read operations. An LLR assignment of {5, 2, −6} is established and soft LDPC decoding is executed during step 815. If it is determined during step 820 that the soft LDPC decoding was successful following the read retry, then Δ (corresponding to the offset that provided a successful decoding) is stored during step 825. In other words, Δ is a location for an optimum read operation.

Thus, if similar pages (e.g., same block or otherwise known to be similar) are read, Δ should be used for the initial read or Δ should be used as a higher priority read retry for this page type (e.g., pages having shared characteristics). For example, the same successful voltage offset can be used for other pages in the same group (e.g., based on side knowledge) or other similar pages (e.g., written at substantially the same time, having a similar location in a block (e.g., page 100 of block 1 is similar to page 100 of block 2) or in the presence of burst errors (e.g., pages failing at the same time).

If, however, it is determined during step 820 that soft LDPC decoding was not successful, then another read retry is performed at −Δ during step 830, where −Δ is the new center read of three read operations. An LLR assignment of {5, −1, −2, −6} is established and soft LDPC is executed during step 835. If it is determined during step 840 that the soft LDPC decoding was successful following the latest read retry, then −Δ is stored during step 845.

If, however, it is determined during step 840 that soft LDPC decoding was not successful, then another read retry is performed at +2Δ during step 850, where +2Δ is the new center read of four read operations. An LLR assignment of {5, 4, 2, 1, −6} is established and soft LDPC is executed during step 855. If it is determined during step 860 that soft LDPC decoding was successful following the latest read retry, then +2Δ is stored during step 865.

If, however, it is determined during step 860 that soft LDPC decoding was not successful, then another read retry is performed at −2Δ during step 870, where −2Δ is the new center read of five read operations. An LLR assignment of {6, −1, −2, −4, −5, −6} is established and soft LDPC is executed during step 875. If it is determined during step 880 that soft LDPC decoding was successful following the latest read retry, then −2Δ is stored during step 882.

If, however, it is determined during step 880 that soft LDPC decoding was not successful, then another read retry is performed at +3Δ during step 884, where +2Δ is the center read of six read operations. An LLR assignment of {6, 5, 4, 2, 1, −1, −6} is established and soft LDPC is executed during step 886. If it is determined during step 888 that soft LDPC decoding was successful following the latest read retry, then +2Δ is stored during step 890.

If, however, it is determined during step 888 that soft LDPC decoding was not successful, then another read retry is performed at −3Δ during step 892, −2Δ is center read of seven read operations during step 892. An LLR assignment of {5, 1, −1, −2, −4, −5, −6, −7} is established and soft LDPC is executed during step 894. If it is determined during step 896 that soft LDPC decoding was successful following the latest read retry, then −2Δ is stored during step 898.

If, however, it is determined during step 896 that soft LDPC decoding was not successful, then additional retry methods can optionally be attempted.

Figure 9:
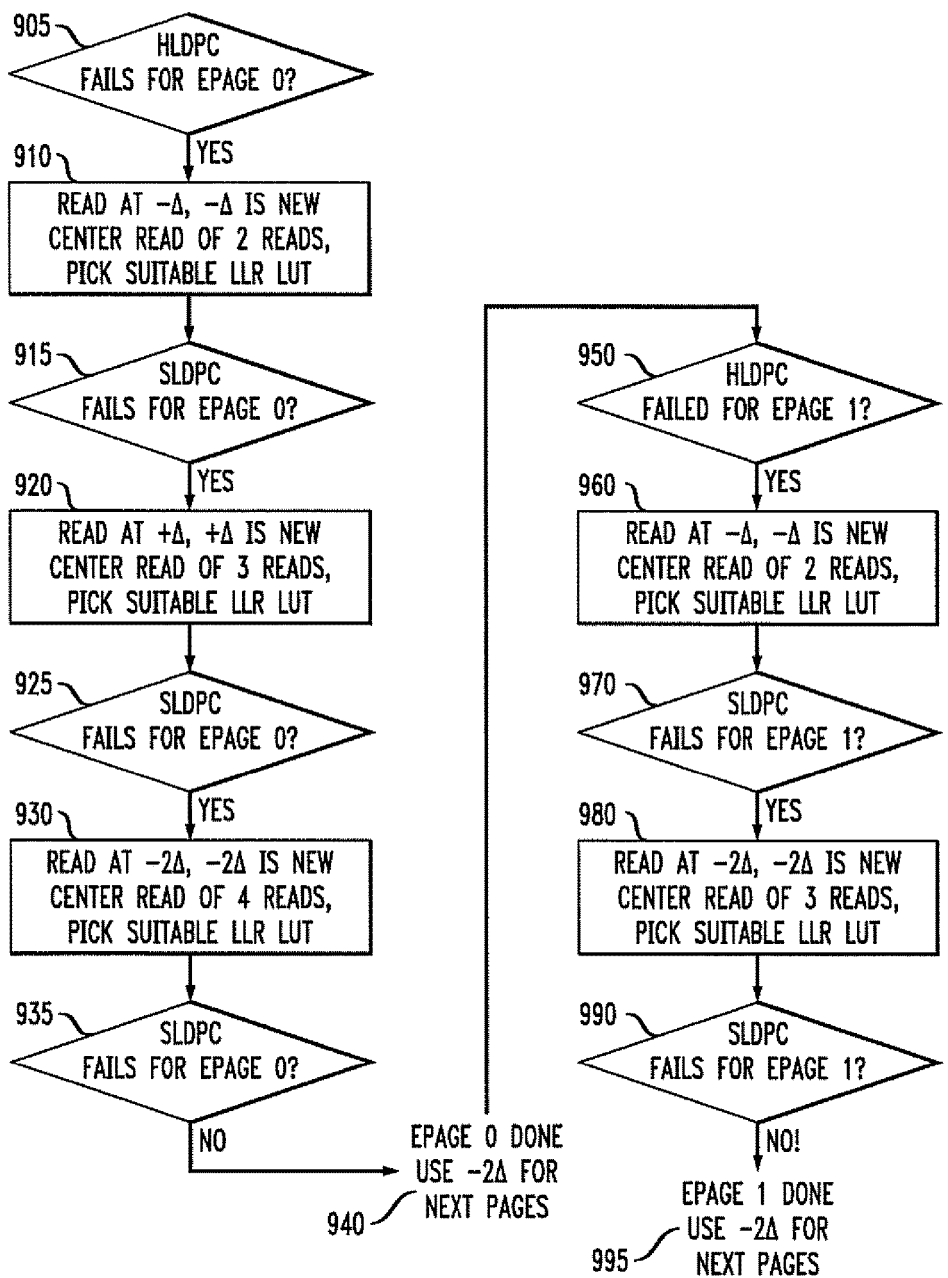

FIG. 9 is a flow chart illustrating an implementation of a read retry process 900 according to another embodiment of the invention. As shown in FIG. 9, it is determined during step 905 that the hard LDPC decoding has failed for an ECC page (e.g., Epage 0), then the read retry process 900 performs a read operation at −Δ during step 910, where −Δ is the new center read of two read operations and the LLR LUT 600 is chosen using the design rules described herein.

If it is determined during step 915 that soft LDPC decoding was not successful for Epage 0 for the current read retry, then another read retry is performed at +Δ during step 920, where +Δ is the new center read of three read operations and the LLR LUT 600 is modified.

If it is determined during step 925 that soft LDPC decoding was not successful for Epage 0 for the current read retry, then another read retry is performed at −2Δ during step 930, where −2Δ is the new center read of four read operations and the LLR LUT 600 is modified.

If it is determined during step 935 that soft LDPC decoding was successful for encode page (Epage) 0 for the current read retry, then decoding of Epage 0 is complete and −2Δ is stored (corresponding to successful decoding) for next pages during step 940. In other words, −2Δ is the location for an optimum read operation. If similar pages are read (e.g., from the same locality in block/die or otherwise known to be similar), −2Δ can be used for the initial read or −2Δ can be increased to a higher priority read retry.

As shown in FIG. 9, it is determined during step 950 that the hard LDPC decoding has failed for another ECC page (e.g., Epage 1), then the read retry process 900 performs a read operation at −Δ during step 960, where −Δ is the new center read of two read operations and the LLR LUT 600 is modified.

If it is determined during step 970 that soft LDPC decoding was not successful for Epage 1 for the current read retry, then another read retry is performed at −2Δ during step 980, where −2Δ is the new center read of three read operations and the LLR LUT 600 is modified. −2Δ is selected because the read retry process 900 stored −2Δ when similar Epage 0 successfully decoded (step 940).

If it is determined during step 990 that soft LDPC decoding was successful for Epage 1 for the current read retry, then decoding of Epage 1 is complete and −2Δ (corresponding to a successful decoding) is stored for next pages during step 995.

One or more embodiments balance the number of reads among retention compensation (exhibiting negative reference voltage shifts) and endurance/read disturb compensation (exhibiting positive reference voltage shifts) scenarios. Alternatively, if three read operations are performed for endurance first, then the endurance scenario will obtain soft LLR values from the second, third and fourth read operations, while the retention scenario will obtain soft LLR values from the fifth, sixth and seventh read operations. If read operations targeting endurance and retention are interleaved, both scenarios receive comparable soft LDPC and reference voltage search trials.

The order of the LLR sign changes in one or more embodiments is based on balancing throughput throughout life, which is designed to reduce the average number of required read operations to successfully decode, especially for those codewords that are more likely to enter a read retry mode. For example, if an on-the-fly read is performed at offset 0, pages with optimal reference voltages ($V_{REF}$) at −2Δ at end-of-life and a page with a reference voltage ($V_{REF}$) at −Δ at beginning-of-life. Then, a reference voltage of −2Δ is used before a reference voltage of −Δ as the end-of-life page entered retry with a higher probability.

It is not always the case that retention or endurance would result in a negative or positive deviation above the default voltage. Instead, in certain flash channel types, and for a noise such as long retention degradation, the distributions widen without a notable change in the location of tail intersection. In such a case, the decoding performance benefits more from soft LLRs because distributions are more Gaussian and there is less LLR saturation. As a result, one would perform a fixed sign change at a default read voltage instead of a blind search for optimal reference voltages via frequent LLR sign changes.

Variations

For each new flash read, all LLR assignments can be exhausted with multiple decoding trials before requesting further flash reads, or some LLR assignments can be tested based on the list of optimal reference voltages provided by tracking and the syndrome weight or disparity of the failed trials up to this trial.

In another variation, the first two or three read operations can assume that the default reference voltage is sufficient and introduce soft information about the default reference voltage. When the retry mode progresses from the second read operation to the third read operation, the LLR values near the default reference voltage can be dampened to account for endurance widening of distributions. If the decoder fails to converge after these two or three read operations, it can be assumed that it is a retention event. Therefore, the default reference voltage is assumed to move to the left by 1Δ count-note. Moving, however, does not mean reading is done at this moved default reference voltage. Rather, it means that the LLR table 600 is altered under this assumption. Two reads can continue at this new default reference voltage.

This variation recognizes that retention can be taken care with other system level algorithms, such as read scrub, and typical retention at any point may be assumed to be no more than a month or two. Therefore, in one or more embodiments, the retention coverage is moved to the fourth, fifth and sixth read operations. Endurance, typically, doesn't move the voltage too far from the default reference voltage so the default reference voltage is kept unchanged and dampened LLRs are used in regions closer to the default reference voltage as more reads are performed.

CONCLUSION

The foregoing applications and associated embodiments should be considered as illustrative only, and numerous other embodiments can be configured using the read threshold voltage adjustment techniques and LLR constellation assignment techniques disclosed herein. According to one or more embodiments, the methods and processes described herein may be implemented in a controller as software, hardware, or any combination of the two.

For example, the methods and processes described herein may be stored in a memory as part of the firmware of a solid state storage device and may be executed by a processor for performing the methods and processes described herein. The methods and processes described herein may alternatively or additionally be stored in other computer-readable media accessible by the controller. In further embodiments, the methods and processes described herein may be implemented in a computing system external to and operably connected to the storage device, such as in a driver module of a host device connected to storage device through an interface, for example. The methods and processes described herein may further be stored in a memory or other computer-readable media accessible by the computing system and be executed by a processor of the computing system.

It should also be understood that the read threshold voltage adjustment techniques and LLR constellation assignment techniques, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed read threshold voltage adjustment techniques and LLR constellation assignment techniques may be implemented using one or more processing platforms. One or more of the processing modules or other components may therefore each run on a computer, storage device or other processing platform element. A given such element may be viewed as an example of what is more generally referred to herein as a "processing device."

Figure 10:
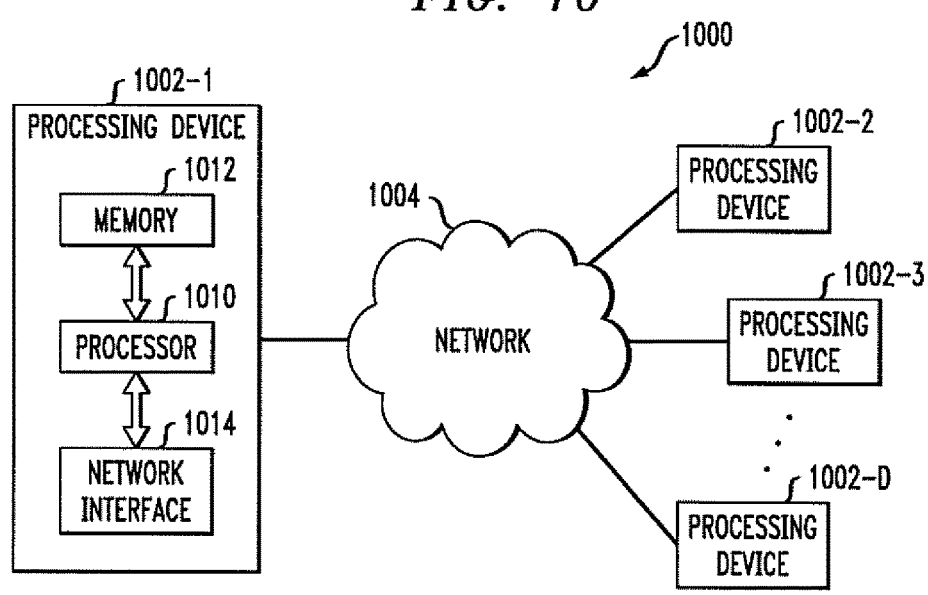
FIG. 10 illustrates a processing platform that may be used to implement at least a portion of one or more embodiments of the invention.

Referring now to FIG. 10, one possible processing platform that may be used to implement at least a portion of one or more embodiments of the invention is shown. The processing platform 1000 in this embodiment comprises at least a portion of the given system and includes at least one processing device(s), denoted 1002-1, 1002-2, 1002-3, . . . 1002-D, which communicate with one another over a network 1004. The network 1004 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 1002-1 in the processing platform 1000 comprises a processor 1010 coupled to a memory 1012. The processor 1010 may comprise a microprocessor, a microcontroller, an application specific integrated circuit (ASIC), a field programmable gate array (FPGA) or other type of processing circuitry, as well as portions or combinations of such circuitry elements, and the memory 1012, which may be viewed as an example of a "computer program product" having executable computer program code embodied therein, may comprise random access memory (RAM), read only memory (ROM) or other types of memory, in any combination.

Also included in the processing device 1002-1 is network interface circuitry 1014, which is used to interface the processing device with the network 1004 and other system components, and may comprise conventional transceivers.

The other processing devices 1002, if any, of the processing platform 1000 are assumed to be configured in a manner similar to that shown for processing device 1002-1 in the figure.

Again, the particular processing platform 1000 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 10, or each such element may be implemented on a separate processing platform.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

It should again be emphasized that the above-described embodiments of the invention are presented for purposes of illustration only. Many variations and other alternative embodiments may be used. For example, the techniques are applicable to a variety of other types of solid state storage device that can benefit from the read threshold voltage adjustment processes disclosed herein. Also, the particular configuration of processing device elements shown herein, and the associated read threshold voltage adjustment techniques, can be varied in other embodiments. Moreover, the various simplifying assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A method for multiple read retries of a memory, comprising:
reading a codeword from the memory using a first read voltage to obtain a first read value;
mapping the first read value to one or more first likelihood values based on a first likelihood value assignment that assigns a likelihood value to each of a plurality of possible decision regions of read voltages, wherein the first likelihood value assignment changes sign substantially at the first read voltage;
reading the codeword of the memory using a second read voltage to obtain a second read value, wherein the second read voltage is shifted from the first read voltage to compensate for an expected change in one or more analog voltages of one or more memory cells of the memory; and
mapping the second read value to one or more second likelihood values based on a second likelihood value assignment that assigns a likelihood value to each of the plurality of possible decision regions of read voltages, wherein the second likelihood value assignment changes sign substantially at the second read voltage.

2. The method of claim 1, further comprising the step of generating read data using iterative decoding of the codeword based on one or more of the first likelihood values and the second likelihood values.

3. The method of claim 2, further comprising the step of storing a given read voltage that provides a successful decoding, wherein the given read voltage is used as one or more of the first read voltage and a higher priority retry read voltage for future read operations for pages of a page type of the codeword.

4. The method of claim 3, wherein the page type comprises one or more of pages written at a substantially similar time, pages having a substantially similar page location in a memory block and pages having burst errors at a substantially similar time.

5. The method of claim 1, wherein the second read voltage is shifted from the first read voltage in a direction that compensates for the expected change in the analog voltages of the memory cells due to one or more of charge leakage, program/erase cycles, read disturb, erase disturb.

6. The method of claim 1, wherein the memory comprises a non-volatile memory.

7. The method of claim 1, further comprising the step of recording a history of successful read voltages and using the successful read voltages for a read retry of other pages having one or more of similar channel condition and similar locality as a successfully recovered page, wherein the one or more of the similar channel condition and the similar locality is based on one or more predefined similarity conditions.

8. A non-transitory computer-readable storage medium, wherein one or more software programs when executed by one or more processing devices implement the steps of the method of claim 1.

9. A device comprising:
a controller configured to perform multiple read retries of a memory by implementing the following steps:
reading a codeword from the memory using a first read voltage to obtain a first read value;
mapping the first read value to one or more first likelihood values based on a first likelihood value assignment that assigns a likelihood value to each of a plurality of possible decision regions of read voltages, wherein the first likelihood value assignment changes sign substantially at the first read voltage;
reading the codeword of the memory using a second read voltage to obtain a second read value, wherein the second read voltage is shifted from the first read voltage to compensate for an expected change in one or more analog voltages of one or more memory cells of the memory; and
mapping the second read value to one or more second likelihood values based on a second likelihood value assignment that assigns a likelihood value to each of the plurality of possible decision regions of read voltages, wherein the second likelihood value assignment changes sign substantially at the second read voltage.

10. The device of claim 9, further comprising the step of generating read data using iterative decoding of the codeword based on one or more of the first likelihood values and the second likelihood values.

11. The device of claim 10, further comprising the step of storing a given read voltage that provides a successful decoding, wherein the given read voltage is used as one or more of the first read voltage and a higher priority retry read voltage for future read operations for pages of a page type of the codeword.

12. The device of claim 11, wherein the page type comprises one or more of pages written at a substantially similar time, pages having a substantially similar page location in a memory block and pages having burst errors at a substantially similar time.

13. The device of claim 9, wherein the second read voltage is shifted from the first read voltage in a direction that compensates for the expected change in the analog voltages of the memory cells due to one or more of charge leakage, program/erase cycles, read disturb, erase disturb.

14. The device of claim 9, wherein the memory comprises a non-volatile memory.

15. The device of claim 9, further comprising the step of recording a history of successful read voltages and using the successful read voltages for a read retry of other pages having one or more of similar channel condition and similar locality as a successfully recovered page, wherein the one or more of the similar channel condition and the similar locality is based on one or more predefined similarity conditions.

16. An apparatus for multiple read retries of a memory, comprising:
a memory; and
at least one processing device, coupled to the memory, operative to implement the following steps:
reading a codeword from the memory using a first read voltage to obtain a first read value;
mapping the first read value to one or more first likelihood values based on a first likelihood value assignment that assigns a likelihood value to each of a plurality of possible decision regions of read voltages, wherein the first likelihood value assignment changes sign substantially at the first read voltage;

reading the codeword of the memory using a second read voltage to obtain a second read value, wherein the second read voltage is shifted from the first read voltage to compensate for an expected change in one or more analog voltages of one or more memory cells of the memory; and mapping the second read value to one or more second likelihood values based on a second likelihood value assignment that assigns a likelihood value to each of the plurality of possible decision regions of read voltages, wherein the second likelihood value assignment changes sign substantially at the second read voltage.

17. The apparatus of claim 16, further comprising the step of generating read data using iterative decoding of the codeword based on one or more of the first likelihood values and the second likelihood values.

18. The apparatus of claim 17, further comprising the step of storing a given read voltage that provides a successful decoding, wherein the given read voltage is used as one or more of the first read voltage and a higher priority retry read voltage for future read operations for pages of a page type of the codeword.

19. The apparatus of claim 16, wherein the second read voltage is shifted from the first read voltage in a direction that compensates for the expected change in the analog voltages of the memory cells due to one or more of charge leakage, program/erase cycles, read disturb, erase disturb.

20. The apparatus of claim 16, further comprising the step of recording a history of successful read voltages and using the successful read voltages for a read retry of other pages having one or more of similar channel condition and similar locality as a successfully recovered page, wherein the one or more of the similar channel condition and the similar locality is based on one or more predefined similarity conditions.

\* \* \* \* \*

UNITED STATES PATENT AND TRADEMARK OFFICE
CERTIFICATE OF CORRECTION

Page 1 of 1

PATENT NO. : 9,633,740 B1
APPLICATION NO. : 15/041501
DATED : April 25, 2017
INVENTOR(S) : AbdelHakim S. Alhussien et al.

It is certified that error appears in the above-identified patent and that said Letters Patent is hereby corrected as shown below:

Column 9, Line 38, please add the following after "Non-Volatile Memory," --(now U.S. Patent No. 9,595,320),--.

Column 11, Lines 13-14, replace "references voltages" with --reference voltages--.

Column 11, Line 18, replace "voltages levels" with --voltage levels--.

Column 12, Line 6, replace "decisions regions" with --decision regions--.

Column 16, Lines 13-14, replace "A smaller A voltage" with --A smaller Δ voltage--.

Signed and Sealed this
Sixth Day of June, 2017

Michelle K. Lee
*Director of the United States Patent and Trademark Office*